(12) United States Patent
Kim et al.

(10) Patent No.: US 12,156,339 B2
(45) Date of Patent: Nov. 26, 2024

(54) CAMERA MODULE

(71) Applicant: LG INNOTEK CO., LTD., Seoul (KR)

(72) Inventors: Suk Ho Kim, Seoul (KR); Sang Hyuck Nam, Seoul (KR); Seok Jun Hong, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 18/021,974

(22) PCT Filed: Aug. 17, 2021

(86) PCT No.: PCT/KR2021/010881
§ 371 (c)(1),
(2) Date: Feb. 17, 2023

(87) PCT Pub. No.: WO2022/039472
PCT Pub. Date: Feb. 24, 2022

(65) Prior Publication Data
US 2023/0309235 A1 Sep. 28, 2023

(30) Foreign Application Priority Data
Aug. 20, 2020 (KR) .................. 10-2020-0104721

(51) Int. Cl.
*H05K 1/18* (2006.01)
*G02B 5/20* (2006.01)
(Continued)

(52) U.S. Cl.
CPC ............. *H05K 1/182* (2013.01); *H04N 25/20* (2023.01); *H04N 25/77* (2023.01); *G02B 5/208* (2013.01);
(Continued)

(58) Field of Classification Search
CPC ......... H05K 1/182; H05K 2201/09036; H05K 2201/10121; H05K 2201/10151;
(Continued)

(56) References Cited

U.S. PATENT DOCUMENTS 9,106,819 B1 * 8/2015 Gao .................. H04N 23/54
9,766,424 B2 * 9/2017 Kim .................. H04N 23/55
(Continued)

FOREIGN PATENT DOCUMENTS

KR 10-2007-0074884 A 7/2007
KR 10-0769713 B1 10/2007
(Continued)

*Primary Examiner* — Chiawei Chen
(74) *Attorney, Agent, or Firm* — Birch, Stewart, Kolasch & Birch, LLP (57) ABSTRACT

A camera module according to an embodiment includes a printed circuit board; an infrared filter disposed on an upper surface of the printed circuit board; and an image sensor disposed under a lower surface of the printed circuit board, wherein the printed circuit board includes: an insulating layer including a cavity overlapping at least a part of the infrared filter and at least a part of the image sensor in an optical axis direction; and a circuit pattern buried in the insulating layer and connected to a terminal of the image sensor; and wherein a shape of the cavity is different from a shape of the image sensor.

19 Claims, 9 Drawing Sheets

(51) Int. Cl.
  *G02B 7/02* (2021.01)
  *H04N 25/20* (2023.01)
  *H04N 25/77* (2023.01)

(52) U.S. Cl.
  CPC .... *G02B 7/021* (2013.01); *H05K 2201/09036* (2013.01); *H05K 2201/10121* (2013.01); *H05K 2201/10151* (2013.01); *H05K 2201/10984* (2013.01)

(58) Field of Classification Search
  CPC ....... H05K 2201/10984; H05K 3/3436; H05K 1/185; H05K 1/111; H05K 3/28; H04N 25/20; H04N 25/77; H04N 23/54; H04N 23/52; H04N 23/57; G02B 5/208; G02B 7/021
  See application file for complete search history.

(56) References Cited

U.S. PATENT DOCUMENTS

| | | | |
|---|---|---|---|
| 11,165,936 B2 | 11/2021 | Park et al. | |
| 11,665,414 B2 | 5/2023 | Park et al. | |
| 11,782,329 B2* | 10/2023 | Park | H04N 23/60 348/294 |
| 11,979,652 B2 | 5/2024 | Paik et al. | |
| 12,028,594 B2 | 7/2024 | Park et al. | |
| 2010/0244171 A1 | 9/2010 | Nagamatsu et al. | |
| 2011/0043687 A1* | 2/2011 | Chang | H01L 27/14618 348/374 |
| 2018/0270858 A1 | 9/2018 | Kitagawa et al. | |
| 2019/0035701 A1* | 1/2019 | Iwamoto | H01L 27/14636 |
| 2019/0258141 A1* | 8/2019 | Park | H01F 7/16 |
| 2020/0344384 A1* | 10/2020 | Somei | H04N 23/54 |
| 2021/0124894 A1* | 4/2021 | Chang | H05K 13/0469 |
| 2021/0281756 A1 | 9/2021 | Park et al. | |
| 2022/0030151 A1 | 1/2022 | Park et al. | |
| 2022/0086317 A1 | 3/2022 | Paik et al. | |
| 2023/0254557 A1 | 8/2023 | Park et al. | |
| 2023/0336856 A1* | 10/2023 | Park | G03B 5/00 |
| 2024/0251149 A1 | 7/2024 | Paik et al. | |
| 2024/0314412 A1 | 9/2024 | Park et al. | |

FOREIGN PATENT DOCUMENTS

| | | |
|---|---|---|
| KR | 10-0803244 B1 | 2/2008 |
| KR | 10-2010-0098879 A | 9/2010 |
| KR | 10-2012-0007730 A | 1/2012 |
| KR | 10-2014-0000078 A | 1/2014 |
| KR | 10-1632343 B1 | 6/2016 |
| KR | 10-2020-0000938 A | 1/2020 |
| KR | 10-2020-0086077 A | 7/2020 |
| WO | WO2015/111922 A1 | 7/2015 |

\* cited by examiner

CAMERA MODULE

CROSS REFERENCE TO RELATED APPLICATIONS

This application is the National Phase of PCT/KR2021/010881 filed on Aug. 17, 2021, which claims priority under 35 U.S.C. § 119(a) to Patent Application No. 10-2020-0104721 filed in the Republic of Korea on Aug. 20, 2020, all of which are hereby expressly incorporated by reference into the present application.

TECHNICAL FIELD

The embodiment relates to a camera module.

BACKGROUND ART

Recently, the demand for small camera modules is increasing for various multimedia fields such as notebook-type personal computers, camera phones, PDAs, smart phones, and toys, and image input devices such as information terminals for surveillance cameras and video tape recorders.

A pixel size of the sensor applied to the camera module is miniaturized and the height of the module is lowered, and accordingly, the development of a mount structure for securing mechanical reliability of the camera module, such as management of the inflow of foreign substances and tilt or shift of the optical axis of the lens, has emerged as a very important topic.

Such a camera module includes a printed circuit board on which a sensor is mounted. In this case, the printed circuit board has a structure in which a cavity is formed in a region where a sensor is mounted. The cavity formed in the printed circuit board can be used for various purposes. For example, a reinforcing plate for improving the flatness of the sensor or dissipating heat of the sensor may be disposed in the cavity. For example, an infrared filter and a sensor may be disposed facing each other on both sides of the printed circuit board with the cavity interposed therebetween, thereby reducing an overall size of the camera module.

However, foreign substances are generated in a process of forming a cavity in the printed circuit board, and as the foreign substances are introduced into the active pixel region of the sensor, it causes a reliability problems.

DISCLOSURE

Technical Problem

The embodiment provides a printed circuit board for a sensor having a novel structure and a camera module including the same.

In addition, the embodiment provides a printed circuit board for a sensor including a cavity having a shape different from that of the sensor and a camera module including the same.

In addition, the embodiment provides a printed circuit board for a sensor capable of improving the flatness of the sensor and a camera module including the same.

In addition, the embodiment provides a printed circuit board for a sensor capable of improving the resolution of the camera module and a camera module including the same.

In addition, the embodiment provides a printed circuit board for a sensor capable of minimizing a thickness deviation of a circuit pattern and a camera module including the same.

In addition, the embodiment provides a printed circuit board for a sensor capable of improving high-temperature electrical reliability and durability, and a camera module including the same.

The technical problems to be achieved in the proposed embodiment are not limited to the technical problems mentioned above, and other technical problems not mentioned in the embodiments will be clearly understood by those of ordinary skill in the art to which the embodiments proposed from the description below.

Technical Solution

A camera module according to an embodiment includes a printed circuit board; an infrared filter disposed on an upper surface of the printed circuit board; and an image sensor disposed under a lower surface of the printed circuit board, wherein the printed circuit board includes: an insulating layer including a cavity overlapping at least a part of the infrared filter and at least a part of the image sensor in an optical axis direction; and a circuit pattern buried in the insulating layer and connected to a terminal of the image sensor; and wherein a shape of the cavity is different from a shape of the image sensor.

In addition, the image sensor has a square shape, and the cavity has a circular shape.

In addition, a width of an upper surface of the cavity is the same as a width of a lower surface of the cavity.

In addition, an inner wall of the cavity is perpendicular to the upper or lower surface of the insulating layer.

In addition, a surface roughness of an inner wall of the cavity has a range of 0.01 um to 0.1 um.

In addition, the image sensor includes a pixel region and a passivation region, and wherein the image pixel region includes a first region overlapping the cavity in the optical axis direction and a second region overlapping the insulating layer in the optical axis direction.

In addition, the image sensor includes an active pixel region, a dummy pixel region, and a passivation region; wherein the active pixel region overlaps the cavity in the optical axis direction; wherein the dummy pixel region includes a first region overlapping the cavity in the optical axis direction together with the active pixel region, and a second region overlapping the insulating layer in the optical axis direction.

In addition, the second region includes a corner region of the dummy pixel region of the image sensor.

In addition, the printed circuit board includes a first protective layer disposed on the upper surface of the insulating layer, wherein the first protective layer includes: a first-first protective layer disposed on the upper surface of the insulating layer; and a first-second protective layer disposed on an upper surface of the first-first protective layer and having a step with the first-first protective layer.

In addition, the first-first protective layer includes a first opening overlapping the cavity in the optical axis direction; wherein the first-second protective layer includes a first-second protective layer including a second opening overlapping the cavity and the first opening in an optical axis direction; wherein the second opening of the first-second protective layer overlaps a part of an upper surface of the first-second protective layer in the optical axis direction; and wherein the infrared filter is disposed on an upper surface of the first-first protective layer overlapping the second opening of the first-second protective layer in the optical axis direction.

On the other hand, the camera module according to the embodiment includes a lens barrel including a lens; a printed circuit board disposed under the lens barrel and including a cavity overlapping the lens in an optical axis direction; an infrared filter disposed on an upper surface of the printed circuit board; and an image sensor disposed under a lower surface of the printed circuit board and directly facing the infrared filter through the cavity; wherein the printed circuit board includes: an insulating layer including a cavity; and a circuit pattern buried in the insulating layer and connected to a terminal of the image sensor; and wherein the cavity has a shape different from that of the image sensor and has a shape corresponding to the lens.

In addition, the image sensor has a square shape, and the lens and the cavity has a circular shape.

In addition, a width of an upper surface of the cavity is the same as a width of a lower surface of the cavity, an inner wall of the cavity is perpendicular to the upper or lower surface of the insulating layer, and a surface roughness of an inner wall of the cavity has a range of 0.01 um to 0.1 um.

In addition, the image sensor includes a pixel region including an active pixel region and a dummy pixel region, and a passivation region; wherein an entire region of the active pixel region overlaps the cavity in the optical axis direction; wherein the dummy pixel region includes a first region overlapping the cavity in the optical axis direction together with the active pixel region, and a second region overlapping the insulating layer in the optical axis direction, and the second region includes a corner region of the dummy pixel region of the image sensor.

In addition, the printed circuit board includes a first protective layer disposed on the upper surface of the insulating layer, a pad buried in the lower surface of the insulating layer, a second protective layer disposed under the lower surface of the insulating layer and including an opening exposing the pad; and a solder ball disposed in the opening of the second protective layer and connected to the pad; and wherein the first protective layer includes a first-first protective layer and a first-second protective layer having different physical properties and forming a step on which the infrared filter is seated.

On the other hand, the manufacturing method of the camera module according to the embodiment includes preparing the carrier board; forming a circuit pattern on the carrier board; forming an insulating layer covering the circuit pattern on the carrier board; removing the caviar board to expose a lower surface of the circuit pattern embedded in the insulating layer; forming a first protective layer and a second protective layer on the upper and lower surfaces of the insulating layer, forming a cavity penetrating the upper and lower surfaces of the insulating layer using a CNC drill, attaching an infrared filter to the first protective layer; and mounting an image sensor connected to the circuit pattern on the lower surface of the insulating layer, wherein the image sensor has a square shape, the cavity has a circular shape corresponding to a lens through which light is incident, a width of an upper surface of the cavity is the same as a width of a lower surface of the cavity, an inner wall of the cavity is perpendicular to the upper or lower surface of the insulating layer, and a surface roughness of an inner wall of the cavity has a range of 0.01 um to 0.1 um, the image sensor includes a pixel region including an active pixel region and a dummy pixel region, and a passivation region; wherein an entire region of the active pixel region overlaps the cavity in the optical axis direction; wherein the dummy pixel region includes a first region overlapping the cavity in the optical axis direction together with the active pixel region, and a second region overlapping the insulating layer in the optical axis direction, and the second region includes a corner region of the dummy pixel region of the image sensor, and wherein the first protective layer includes a first-first protective layer and a first-second protective layer having different physical properties and forming a step on which the infrared filter is seated.

Advantageous Effects

The printed circuit board of the embodiment has an ETS structure in which a circuit pattern is embedded in an insulating layer. Accordingly, the printed circuit board of the embodiment can achieve miniaturization. Furthermore, the embodiment does not need to increase the size of the printed circuit board through miniaturization of the circuit pattern even if the number of terminals increases according to the increase in pixels of the image sensor, and thus the size of the printed circuit board can be reduced.

In addition, the comparative example allows foreign substance such as burrs to remain on the inner wall of the cavity as the cavity is formed through laser processing, and this foreign substance later falls on the image sensor and causes a reliability problem.

Alternatively, the embodiment can completely remove the foreign substance present on the inner wall of the cavity by forming a cavity using a CNC drill, and thereby solving the reliability problem. In addition, the embodiment may form the cavity (C) using a CNC drill, so that an upper width and a lower width of the cavity (C) are the same as each other. That is, the inner wall of the cavity C of the embodiment may be perpendicular to an upper surface or a lower surface of the insulating layer 91. Accordingly, the embodiment can accurately form the cavity (C) corresponding to a target size in the insulating layer, thereby solving the problem of increasing the size of a circuit board.

In addition, the embodiment forms a step on a protective layer made of solder resist, and arranges an infrared filter on the step. Accordingly, the embodiment does not require a separate structure for arranging the infrared filter, thereby reducing a product cost and reducing an overall height of the camera module.

DETAILED DESCRIPTION OF THE EMBODIMENTS

Hereinafter, embodiments of the present invention will be described in detail with reference to the accompanying drawings.

However, the spirit and scope of the present invention is not limited to a part of the embodiments described, and may be implemented in various other forms, and within the spirit and scope of the present invention, one or more of the elements of the embodiments may be selectively combined and substituted for use.

In addition, unless expressly otherwise defined and described, the terms used in the embodiments of the present invention (including technical and scientific terms may be construed the same meaning as commonly understood by one of ordinary skill in the art to which this invention belongs, and the terms such as those defined in commonly used dictionaries may be interpreted as having a meaning that is consistent with their meaning in the context of the relevant art. Further, the terms used in the embodiments of the present invention are for describing the embodiments and are not intended to limit the present invention.

In this specification, the singular forms may also include the plural forms unless specifically stated in the phrase, and may include at least one of all combinations that may be combined in A, B, and C when described in "at least one (or more) of A (and), B, and C". In addition, the terms such as first, second, A, B, (a), and (b) may be used in describing the elements of the embodiments of the present invention.

These terms are only used to distinguish the elements from other elements, and the terms are not limited to the essence, order, or order of the elements. In addition, when an element is described as being "connected", "coupled", or "contacted" to another element, it may include not only when the element is directly "connected" to, "coupled" to, or "contacted" to other elements, but also when the element is "connected", "coupled", or "contacted" by another element between the element and other elements.

In addition, when described as being formed or disposed "on (over)" or "under (below)" of each element, the "on (over)" or "under (below)" may include not only when two elements are directly connected to each other, but also when one or more other elements are formed or disposed between two elements. In addition, when expressed as "on (over)" or "under (below)", it may include not only the upper direction but also the lower direction based on one element.

Hereinafter, an embodiment of the present invention will be described in detail with reference to the accompanying drawings.

Figure 1:
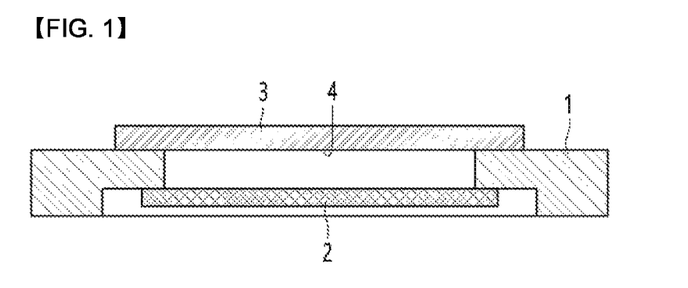
FIG. 1 is a view illustrating a camera module according to a comparative example.
Figure 2:
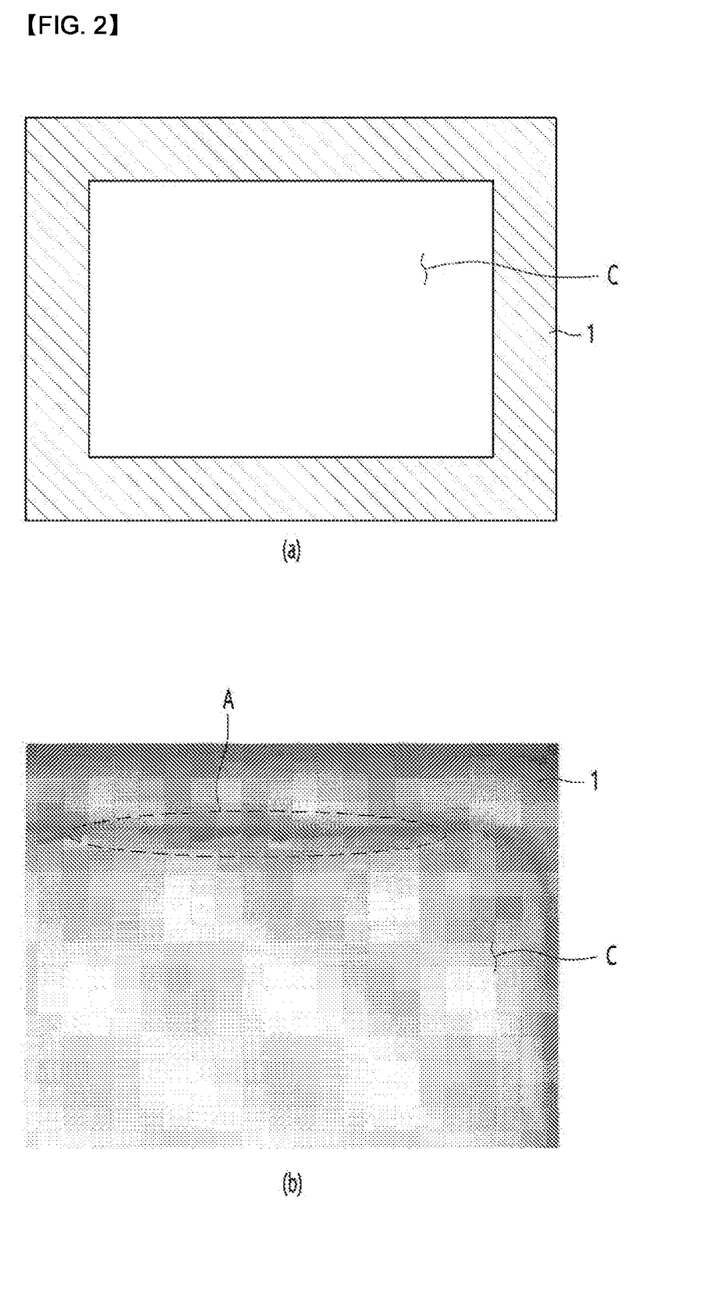
FIG. 2 is a plan view of a printed circuit board of FIG. 1.

FIG. 1 is a view showing a camera module according to a comparative example, and FIG. 2 is a plan view of a printed circuit board of FIG. 1.

Referring to FIG. 1, the camera module of the comparative example includes a printed circuit board 1, a sensor 2, a cover glass 4 and an infrared filter 3.

In the camera module of the comparative example, an infrared filter 3 with a cover glass 4 is attached to on the printed circuit board 1 to prevent contamination by a foreign substance and to block infrared (IR) after bonding the sensor 2 to the printed circuit board 1.

In this case, the camera module of the comparative example as described above forms a separate instrument for fixing or supporting the infrared filter 3 on the printed circuit board 1 and fixes the infrared filter 3 on the instrument formed above.

Accordingly, an overall height of the camera module in the comparative example is increased by a height of the instrument.

In addition, in the camera module in the comparative example, the infrared filter 3 and the sensor 2 are disposed facing each other on both sides of the printed circuit board 1. To this end, a cavity C is formed in the printed circuit board 1. The cavity C in the comparative example is formed by laser processing.

However, various foreign substances due to laser processing remain on the inner wall of the cavity C. In addition, when the sensor 4 is mounted in a situation where the foreign substances are not completely removed, there is a problem in that the foreign substances penetrates into an active pixel region of the sensor 4 and causes image quality deterioration accordingly.

For example, as shown in (b) of FIG. 2, foreign substances such as burrs remain on the inner wall of the cavity C of the printed circuit board 1 by laser processing. In addition, foreign substances remaining on the inner wall of the cavity C fall onto the active pixel region of the sensor 2 in the use environment of the camera module, and thus image quality deterioration occurs.

In addition, the printed circuit board 1 in the comparative example has limitations in circuit miniaturization according to the increase in pixels of the sensor. That is, the printed circuit board in the comparative example has a structure in which a circuit pattern protrudes from the surface of the insulating layer, and thus there is a limit to miniaturization of the circuit. In addition, there is a limit to the increase of pixels of the sensor according to the limit of miniaturization of the circuit.

Hereinafter, a printed circuit board for a sensor and a camera module including the printed circuit board according to an embodiment will be described.

Figure 3:
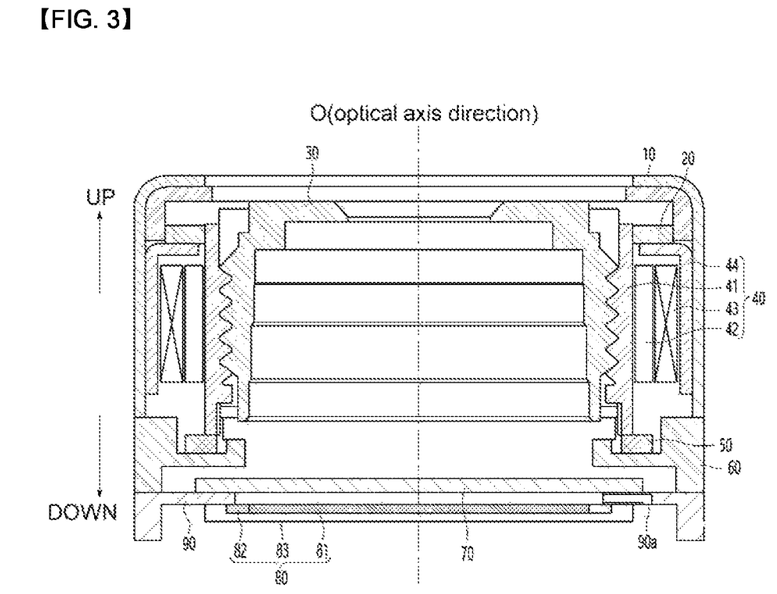
FIG. 3 is a cross-sectional view of a camera module according to an embodiment.
Figure 4:
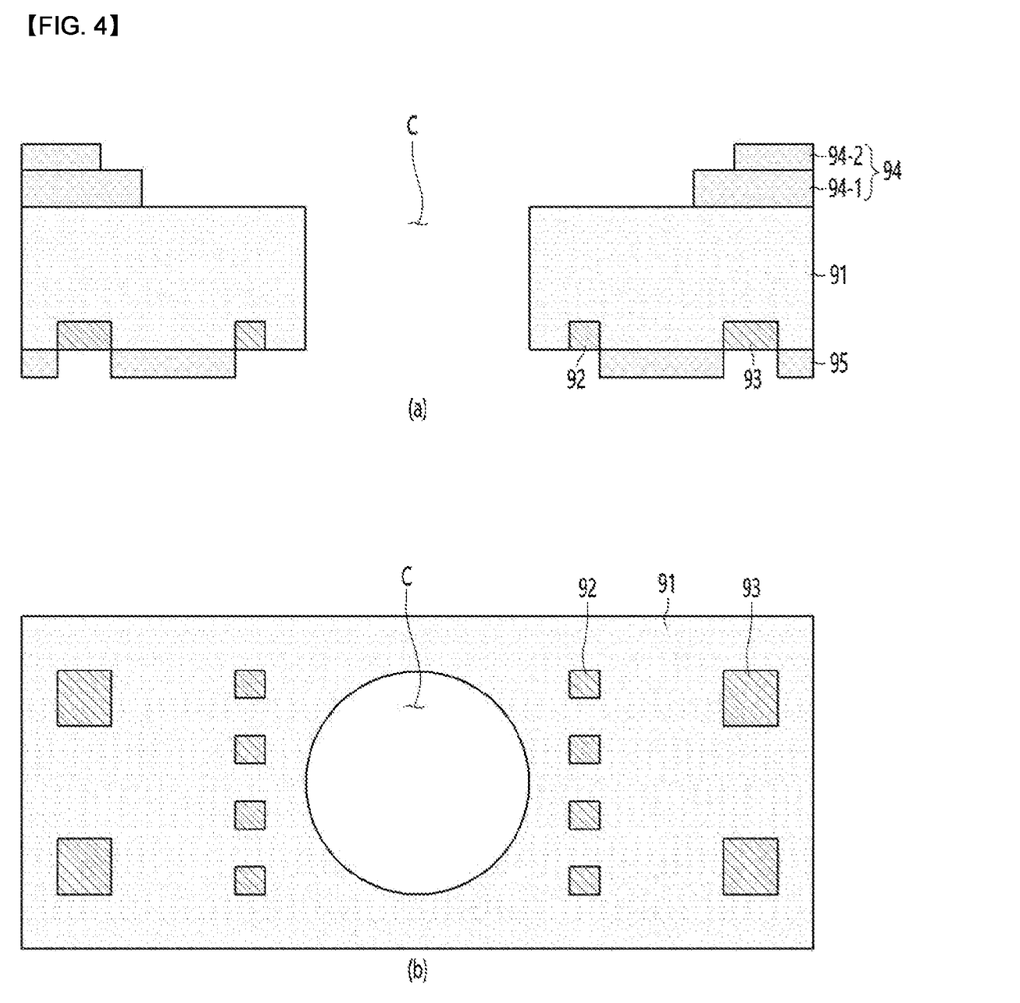
FIG. 4 is a view of a printed circuit board of FIG. 3.

FIG. 3 is a cross-sectional view of a camera module according to an embodiment, and FIG. 4 is a view of a printed circuit board of FIG. 3.

As shown in FIG. 3, the camera module of the embodiment includes a case 10, an upper elastic member 20, a lens barrel 30, an actuator 40, a lower elastic member 50, a frame 60, and an infrared filter 70, an image sensor 80 and a printed circuit board 90.

The present invention shows a camera module including an actuator 40 which is a movable part that moves the lens barrel 30 along the optical axis direction θ for auto focusing. However, the present invention is applicable to a camera module in which the actuator 40 is omitted. The lens barrel 30 of the camera module without the actuator 40 is screwed to the holder instead of the bobbin 41. In the present invention, the bobbin 41 performs the same function as a holder for fixing the lens barrel 30.

The case 10 has a hexahedral shape with an open lower portion and includes a light transmission hole formed in an upper central portion. A lower portion of the case 10 is supported by a frame 60.

The case 10 is combined with the frame 60 to form a space, and an upper elastic member 20, a lens barrel 30, and an actuator 40 are disposed in the space.

The case 10 is preferably made of plastic for internal and external insulation, and may also be injection molded for mass production.

The upper elastic member 20 is inserted in an upper portion of the case 10 as a plate spring, an outer portion of the upper elastic member 20 is supported by the yoke 44 of the actuator 40, and the inner portion of the upper elastic member 20 comes into contact with the bobbin 41 of the actuator 40 and presses an upper side of the bobbin 41.

The lower elastic member 50 is positioned below the actuator 40 as a plate spring and presses the lower side of the bobbin 41.

The lower elastic member 50 may be insert-injected from the bobbin 41 or bonded with a bond.

The lens barrel 30 is a means for fixing and protecting a plurality of lenses. The lens barrel 30 is a means for fixing and protecting a plurality of lenses, and a plurality of lenses capable of entering a light image of a subject are sequentially stacked inside the lens barrel 30 along the optical axis direction θ.

A screw thread is formed on an circumferential surface of the lens barrel 30, and the screw thread is screwed with a screw thread formed on an inner circumferential surface of the bobbin 41.

The bobbin 41 has a cylindrical shape in which an upper portion and a lower portion are open, and a screw thread is formed on an inner circumferential surface of the bobbin to correspond to the screw thread 31 of the lens barrel 30. The present invention may allow the camera module to match long-distance focusing while screwing the lens barrel 30 to the inner circumferential surface of the bobbin 41.

A coil 42 interacts with a permanent magnet 43 and is wound around the bobbin 41 in a direction perpendicular to a magnetic flux.

A yoke 44 prevents a magnetic field between the coil 42 and the permanent magnet 43 from leaking out and is inserted into the case 10, and the permanent magnets 43 are mounted inside the yoke 44 so as to face each other with respect to the bobbin 41. The yoke 44 is supported by frame 60.

When a voltage is applied to the coil 42, a current flowing through the coil and the magnetic field of the permanent magnet 43 interact (Fleming's left-hand rule), so that the bobbin 41 is forced upward in the optical axis direction. In this case, as the intensity of the current applied to the coil 42 increases, an upward movement distance between the lens barrel 30 and the bobbin 41 along the optical axis direction increases.

Subsequently, when the voltage applied to the coil 42 is blocked, the lens barrel 30 and the bobbin 41 move downward along the optical axis direction by the elastic force of the upper elastic member 20 and the lower elastic member 50, will return to its original state.

The frame 60 has a '□' shape with a central opening through which a light image can pass to the image sensor 80, and the frame 60 is positioned below the lens barrel 30.

Such a camera module may be any one of an auto focus (AF) camera module and an optical image stabilizer (OIS) camera module. A camera module for AF refers to one capable of performing only an auto focus function, and a camera module for OIS refers to one capable of performing an auto focus function and an optical image stabilizer (OIS) function. For example, a lens driving device 100 may be a lens driving device for AF or a lens driving device for OIS, and here, the meanings of "for AF" and "for OIS" may be the same as those described in the camera module for AF and the camera module for OIS.

Accordingly, the actuator 40 may be a lens driving device for OIS. Alternatively, the actuator 40 may be a lens driving device for AF.

In addition, the camera module may further include a sensing magnet (not shown) disposed on the bobbin 41 and an AF position sensor (eg, a hall sensor (not shown)) disposed on the case.

In another embodiment, the AF position sensor may be disposed on the bobbin and the sensing magnet may be disposed on the case.

The AF position sensor may output an output signal according to a result of sensing the strength of the magnetic field of the sensing magnet according to the movement of the bobbin 100. The AF position sensor may be electrically connected to the printed circuit board 90 through the upper elastic member (or lower elastic member) and/or the support member. The printed circuit board 90 may provide a driving signal to the AF position sensor, and an output of the AF position sensor may be transmitted to the printed circuit board 90. However, the embodiment is not limited thereto, and the output of the AF position sensor is electrically connected to a separate board (not shown) electrically connected to the printed circuit board 90, and thus can be directly transmitted as a signal to the separate board.

Accordingly, a driving signal (eg, driving current) may be provided to the coil 42 of the embodiment, and the bobbin may be moved in the optical axis direction by the electromagnetic force generated by the interaction between the coil 42 and the permanent magnet 43. In another embodiment, the arrangement positions of the coil 42 and the permanent magnet 43 may be interchanged.

An image sensor 80 and an infrared filter 70 may be attached to the printed circuit board 90. That is, the printed circuit board 90 may be a sensor board for mounting the image sensor 80. As another example, the printed circuit board 90 may be a filter board to which the infrared filter 70 is attached.

A cavity C may be formed in the printed circuit board 90. In addition, the image sensor 80 and the infrared filter 70 may be respectively disposed on different surfaces of the printed circuit board 90 with the cavity C interposed therebetween. For example, the image sensor 80 may be mounted under a lower surface of the printed circuit board 90. For example, the infrared filter 70 may be attached on an upper surface of the printed circuit board 90. Accordingly, at least a part of the lower surface of the infrared filter 70 and at least a part of the upper surface of the image sensor 80 may be positioned to directly face each other with the cavity C interposed therebetween.

Referring to FIG. 4, the printed circuit board 90 may include an insulating layer 91, a circuit pattern 92, a pad 93, a first protective layer 94 and a second protective layer 95.

The printed circuit board 90 of the embodiment may include a single insulating layer. That is, the printed circuit board 90 may have a one-layer structure based on the insulating layer.

In addition, the printed circuit board 90 may include a single-layer pattern portion. Here, the pattern portion may include a circuit pattern 92 and a pad 93. That is, in the printed circuit board 90 of the embodiment, a pattern portion including the circuit pattern 92 and the pad 93 may be disposed on only one surface of one insulating layer 91.

The insulating layer 91 is a substrate on which an electric circuit capable of changing wiring is formed and may include all of a printed circuit board, a wiring board, and an insulating board that are made of an insulating material capable of forming circuit patterns on a surface thereof.

For example, the insulating layer 91 may be rigid or flexible. For example, the insulating layer 91 may include glass or plastic. In detail, the insulating layer 91 may include chemically tempered/semi-tempered glass such as soda lime glass or aluminosilicate glass, etc., a tempered or flexible plastic such as polyimide (PI), or polyethylene terephthalate (PET), propylene glycol (PPG), polycarbonate (PC), etc., or sapphire.

In addition, the insulating layer 91 may include an optical isotropic film. As an example, the insulating layer 91 may include cyclic olefin copolymer (COC), cyclic olefin polymer (COP), optical isotropic polycarbonate (PC), optical isotropic polymethyl methacrylate (PMMA), or the like.

In addition, the insulating layer 91 may be partially bent while having a curved surface. That is, the insulating layer 91 may partially have a plane and may partially be bent while having a curved surface. Specifically, an end portion of the insulating layer 91 may be bent while having a curved surface, or bent or crooked while having a surface with a random curvature.

In addition, the insulating layer 91 may be a flexible substrate having a flexible characteristic. In addition, the insulating layer 91 may be a curved or bent substrate. In this case, the insulating layer 91 expresses electric wires connecting circuit components in a wiring diagram based on a circuit design, and can reproduce electric conductors on the insulating material. In addition, at least one of the insulating layers 120 may mount electrical components and form wiring connecting them in a circuit manner, and may mechanically fix components other than the electrical connection function of the components.

A pattern portion may be disposed on a surface of the insulating layer 91. In this case, the printed circuit board 90 of the embodiment may be a single-sided printed circuit board. Accordingly, the printed circuit board 90 may include one insulating layer and a pattern portion disposed only on one surface of the insulating layer.

The pattern part may include a circuit pattern 92 and a pad 93. The circuit pattern 92 is for signal transmission and may be a pattern on which the image sensor 80 is mounted. The pad 93 may be a bonding pad for attaching the camera module as described above to an optical device such as a mobile terminal. The circuit pattern 92 and the pad 93 may be simultaneously formed in a same process. However, the circuit pattern 92 and the pad 93 have different functions, and thus may have different widths.

The circuit pattern 92 of the embodiment may have a line width of 6 μm±1 μm. In addition, the circuit patterns 92 of the embodiment may have a pitch of 6 μm±1 μm. That is, the circuit pattern 92 of the embodiment is a fine circuit pattern.

That is, a resolution of the image sensor is increasing in order to improve the performance of the recent camera module. Accordingly, a number of terminals disposed on the image sensor 80 to be connected to the circuit pattern 92 of the printed circuit board 90 increases in response to the increase in resolution. In this case, when the circuit pattern 92 is not a fine circuit pattern, an area where the circuit pattern 92 is disposed increases correspondingly to the increase in the resolution of the image sensor 80, which increases the overall size of the camera module. In contrast, in the embodiment, the circuit pattern 92 is formed in an embedded trace substrate (ETS) structure. Accordingly, the circuit pattern 92 may be a fine circuit pattern and may be buried in the insulating layer 91.

The circuit pattern 92 or the pad 93 is a wiring that transmits an electrical signal, and may be formed of a metal material having high electrical conductivity. To this end, the circuit pattern 92 and the pad 93 may be formed of at least one metal material selected from among gold (Au), silver (Ag), platinum (Pt), titanium (Ti), tin (Sn), copper (Cu), and zinc (Zn). In addition, the circuit pattern 92 and the pad 93 may be formed of paste or solder paste including at least one metal material selected from among gold (Au), silver (Ag), platinum (Pt), titanium (Ti), tin (Sn), copper (Cu), and zinc (Zn), which are excellent in bonding force. Preferably, the circuit pattern 92 and the pad 93 may be formed of copper (Cu) having high electrical conductivity and a relatively low cost.

A first protective layer 94 may be formed on an upper surface of the insulating layer 91. In addition, a second protective layer 95 may be formed under the lower surface of the insulating layer 91.

The first protective layer 94 may be a protective layer protecting an upper surface of the insulating layer 91. The first protective layer 94 may be a seating portion on which the infrared filter 70 is seated.

The second protective layer 95 may be a protective layer that protects the lower surface of the insulating layer 91 and the lower surface of the circuit pattern 92 or the pad 93.

The first protective layer 94 and the second protective layer 95 may be formed of at least one layer using at least one of SR (Solder Resist), oxide, and Au. Preferably, the first protective layer 94 and the second protective layer 95 may be solder resist.

The first protective layer 94 and the second protective layer 95 may have different layer structures. For example, the first protective layer 94 may have a two-layer structure. In addition, the second protective layer 95 may have a one-layer structure.

The first protective layer 94 may have a two-layer structure. For example, the first protective layer 94 may include a first-first protective layer 94-1 disposed on the upper surface of the insulating layer 91 and a first-second protective layer 94-2 disposed on an upper surface of the first-first protective layer 94-1.

The first-first protective layer 94-1 may directly contact the upper surface of the insulating layer 91. The first-first protective layer 94 1 may have a first opening (not shown) exposing a region in which the cavity C is formed on the upper surface of the insulating layer 91. For example, the first opening formed in the first-first protective layer 94-1 may expose a region where the infrared filter 70 is to be disposed. The first opening may have a size larger than that of the cavity (C). The first opening may have a width smaller than that of the infrared filter 70. Accordingly, at least a part of the first-first protective layer 94-1 may overlap the infrared filter 70 in the optical axis direction.

A first-second protective layer 94-2 may be disposed on the first-first protective layer 94-1. The first-second protective layer 94-2 may directly contact the upper surface of the first-first protective layer 94-1. The first-second protective layer 94 2 may have a second opening (not shown) exposing a region where the cavity C is formed. Also, the second opening of the first-second protective layer 94-2 may overlap the first opening of the first-first protective layer 94-1 in an optical axis direction. Preferably, the second opening of the first-second protective layer 94-2 may have a larger width than the cavity C and the first opening. For example, the second opening of the first-second protective layer 94 2 may be equal to or larger than the infrared filter 70.

In an embodiment, the second opening of the first-second protective layer 94-2 may expose a part of the upper surface of the first-first protective layer 94-1. Also, an upper surface of the first-first protective layer 94-1 exposed through the second opening may function as a seating portion on which the infrared filter 70 is seated.

In an embodiment, the first protective layer 94 including the first-first protective layer 94-1 and the first-second protective layer 94-2 may have a step due to a difference in width between the first opening and the second opening. In addition, the step allows the infrared filter 70 to be stably seated.

Meanwhile, the first-first protective layer 94-1 and the first-second protective layer 94-2 may have a structure in which a resin and a filler are mixed. The first-first protective layer 94-1 and the first-second protective layer 94-2 may be implemented as a photo solder resist film.

The first-first protective layer 94-1 and the first-second protective layer 94-2 may have different properties. Here, the properties may include a coefficient of thermal expansion (CTE) and a filler content.

In this case, the coefficient of thermal expansion of the first-first protective layer 94-1 may be smaller than the coefficient of thermal expansion of the first-second protective layer 94-2. For example, the first-first protective layer 94-1 may have a coefficient of thermal expansion of 10 to 25 ppm (@alpha 1). For example, the first-second protective layer 94-2 may have a coefficient of thermal expansion of 30 to 50 ppm (@alpha 1). That is, in the embodiment, the first-first protective layer 94-1 having a low coefficient of thermal expansion is preferentially disposed on the insulating layer 91, and a first-second protective layer 94-2 having a high thermal expansion coefficient is disposed on the first-first protective layer 94-1, and accordingly, it is possible to minimize the occurrence of warpage of the printed circuit board due to CTE mitigation.

The second protective layer 95 is disposed under the lower surface of the insulating layer 91. The second protective layer 95 may have an opening exposing a region where the image sensor 80 is mounted and a region where a solder ball 96 (to be described later) is disposed.

Meanwhile, a cavity C passing through upper and lower surfaces may be formed in the insulating layer 91. In this case, the cavity (C) may be formed through a CNC drill. Accordingly, the cavity C may have a circular shape. That is, the shape of the cavity C formed in the printed circuit board 90 may be different from that of the image sensor 80. For example, the image sensor 80 may have a rectangular shape, and the cavity C of the printed circuit board 90 may have a circular shape different from that of the image sensor 80.

Specifically, the cavity C formed in the insulating layer 91 may have the same circular shape as the lens disposed in the lens barrel 30. Accordingly, in the embodiment, the loss of light incident through the lens can be minimized by making the cavity C and the lens have the same shape. However, an active pixel region of the image sensor 80 is generally a rectangular region, and accordingly, a size of the cavity C is adjusted so that the active pixel region of the image sensor 80 is not covered by the cavity C. This will be described in detail below.

In the embodiment, since the cavity C is formed by a CNC drill as described above, it is possible to provide a highly reliable printed circuit board 90 compared to the comparative example.

Specifically, when the cavity C is formed through laser processing, the upper width and the lower width of the cavity C are different from each other. In other words, when the cavity is formed by laser processing, the inner wall of the cavity C may have a certain inclination with respect to the upper or lower surface of the insulating layer. Accordingly, in the comparative example, the size of the cavity C must be formed larger than a target size by a region corresponding to the inclination, resulting in an increase in the size of the substrate.

Alternatively, in the embodiment, as the cavity C is formed through a CNC drill, the upper width and the lower width of the cavity C may be equal to each other. That is, the inner wall of the cavity C of the embodiment may be perpendicular to the upper or lower surface of the insulating layer 91. Accordingly, the embodiment can accurately form the cavity (C) corresponding to the target size in the insulating layer 91, thereby solving the problem of increasing the size of the board.

In addition, in the comparative example, as the cavity C is formed through laser processing, a foreign substance such as a burr remains on the inner wall of the cavity C, which causes a reliability problem of the image sensor 80 later.

Alternatively, in the embodiment, as the cavity (C) is formed using a CNC drill, foreign substance present on the inner wall of the cavity (C) can be completely removed, thereby solving the reliability problem.

For example, a surface roughness of the inner wall of the cavity C of the insulating layer 91 of the embodiment may have a range of 0.01 um to 0.1 um. And, the surface roughness of the inner wall of the cavity in the comparative example may have 0.1 μm or more. Accordingly, the embodiment can reduce the surface roughness of the inner wall of the cavity C compared to the comparative example, and it is possible to solve the problem that the foreign substance remaining on the inner wall of the cavity C separates from the insulating layer 91 and falls onto the image sensor 80.

Meanwhile, the insulating layer 91 of the embodiment may include a through hole 90*a* as an air passage. The through hole 90*a* may be an air outlet passage through which expanded air between the infrared filter 70 and the image sensor 80 is discharged to an outside.

Figure 5:
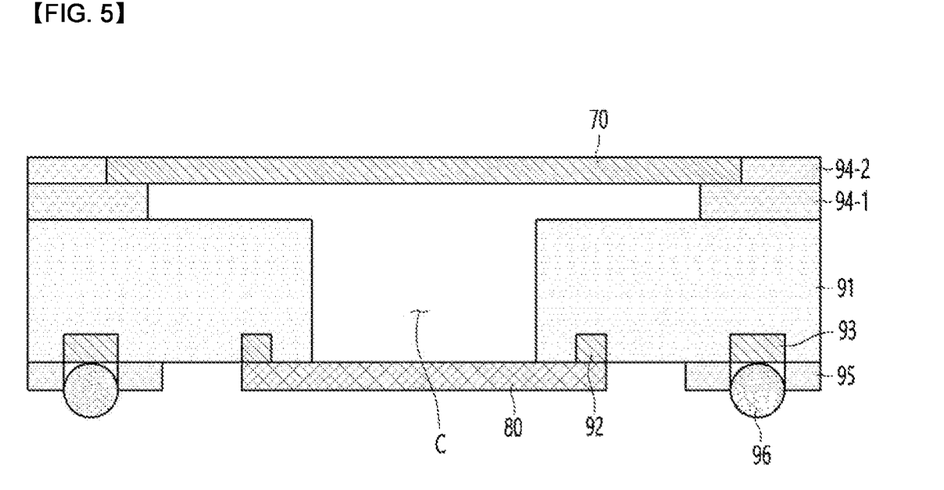
FIG. 5 is a combined view of a printed circuit board, an image sensor, and an infrared filter according to an embodiment.

FIG. 5 is a combined view of a printed circuit board, an image sensor, and an infrared filter according to an embodiment.

Referring to FIG. 5, the embodiment may allow an infrared filter 70 to be disposed on the step provided by changing the size of the first and second openings of the first-first protective layer 94-1 and the first-second protective layer 94-2. That is, in the embodiment, a separate instrument for arranging the infrared filter 70 is unnecessary, and accordingly, it is possible to reduce the product cost and reduce the overall height of the camera module. Meanwhile, an adhesive (not shown) may be applied between the step of the first protective layer 94 and the infrared filter 70. The adhesive may include epoxy, thermosetting adhesive, UV curable adhesive, and the like.

Meanwhile, the second protective layer 95 may expose the lower surface of the circuit pattern 92 and the pad 93 disposed on the lower surface of the insulating layer 91. In addition, the image sensor 80 may be attached to the exposed circuit pattern 92 by a flip chip bonding method. In addition, a solder ball 96 may be disposed below the exposed pad 93.

Figure 6:
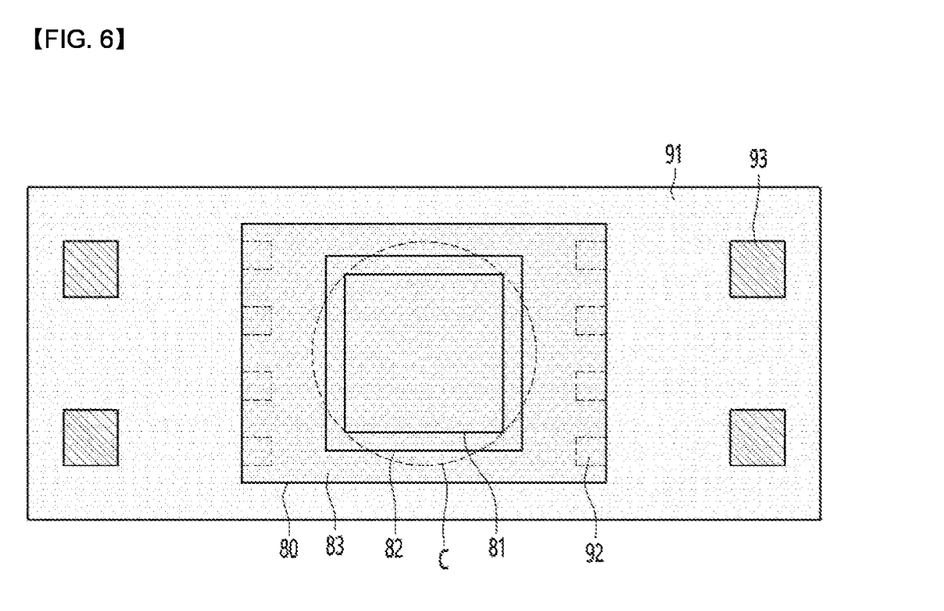
FIGS. 6 and 7 are views for explaining an arrangement position of a cavity of a printed circuit board and an image sensor according to an embodiment.
Figure 7:
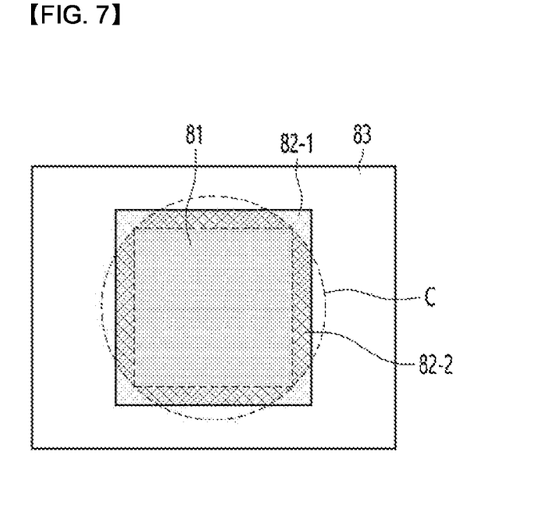

FIGS. 6 and 7 are views for explaining an arrangement position of a cavity of a printed circuit board and an image sensor according to an embodiment.

Referring to FIGS. 6 and 7, the image sensor 80 includes a pixel region composed of a plurality of pixels for detecting a light image (image information) incident through a lens, and a passivation region 83 other than the pixel region.

In addition, the pixel region of the image sensor 80 may include an active pixel region 81 used for sensing actual image information and a dummy pixel region 82 between the active pixel region 81 and the passivation region 83.

In this case, the cavity C may overlap the active pixel region 81 of the image sensor 80 in the optical axis direction. In other words, an entire region of the active pixel region 81 of the image sensor 80 may overlap the cavity C in the optical axis direction. Accordingly, the entire region of the active pixel region 81 of the image sensor 80 may be exposed through the cavity C.

Meanwhile, the dummy pixel region 82 of the image sensor 80 includes a first region 82-1 that does not overlap with the cavity C in the optical axis direction and a second region 82-2 that overlaps with the cavity C in the optical axis direction.

In other words, a part of the dummy pixel region 82 of the image sensor 80 of the embodiment may be exposed as an upper region through the cavity C. In this case, the dummy pixel region 82 is a pixel region not used for detecting the image information, and thus does not affect reliability even if it is not exposed through the cavity C.

However, the entire region of the dummy pixel region 82 may be exposed as an upper region through the cavity C, but, the embodiment allows a partial region to be exposed.

For example, in the embodiment, a corner region of the dummy pixel region 82 does not overlap with the cavity C in the optical axis direction. Therefore, a corner region of the dummy pixel region 82 may be supported by the insulating layer 91 in a process of mounting the image sensor 80 under the lower surface of the insulating layer 91.

Here, the entire region of the dummy pixel region 82 is exposed through the cavity, and accordingly, a corner region of the passivation region 83 other than the dummy pixel region 82 may be supported by the insulating layer 91. However, a problem may occur in the flatness of the image sensor 80 in this case. That is, the passivation region 83 of the image sensor 80 may be thermally pressed in the process of flip-chip bonding of the image sensor in this case, and thus the active pixel region 81 of the image sensor 80 may be bent.

Alternatively, an embodiment may allow to minimize the warping problem of the active pixel region 81 adjacent to the dummy pixel region 82 while the corner region of the dummy pixel region 82 is supported by the insulating layer 91.

The printed circuit board of the embodiment has an ETS structure in which a circuit pattern is embedded in an insulating layer. Accordingly, the printed circuit board of the embodiment can achieve miniaturization. Furthermore, the embodiment does not need to increase the size of the printed circuit board through miniaturization of the circuit pattern even if the number of terminals increases according to the increase in pixels of the image sensor, and thus the size of the printed circuit board can be reduced.

In addition, the comparative example allows foreign substance such as burrs to remain on the inner wall of the cavity as the cavity is formed through laser processing, and this foreign substance later falls on the image sensor and causes a reliability problem.

Alternatively, the embodiment can completely remove the foreign substance present on the inner wall of the cavity by forming a cavity using a CNC drill, and thereby solving the reliability problem. In addition, the embodiment may form the cavity (C) using a CNC drill, so that an upper width and a lower width of the cavity (C) are the same as each other. That is, the inner wall of the cavity C of the embodiment may be perpendicular to an upper surface or a lower surface of the insulating layer 91. Accordingly, the embodiment can accurately form the cavity (C) corresponding to a target size in the insulating layer, thereby solving the problem of increasing the size of a circuit board.

In addition, the embodiment forms a step on a protective layer made of solder resist, and arranges an infrared filter on the step. Accordingly, the embodiment does not require a separate structure for arranging the infrared filter, thereby reducing a product cost and reducing an overall height of the camera module.

FIGS. 8 to 12 are views showing a manufacturing method of a printed circuit board according to an embodiment in order of process.

Figure 8:
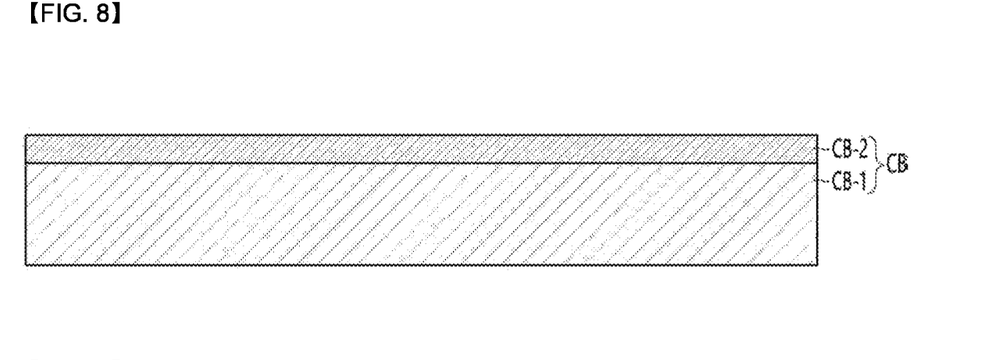
FIGS. 8 to 12 are views showing a manufacturing method of a printed circuit board according to an embodiment in order of process.

Referring to FIG. 8, in the embodiment, a carrier board CB may be prepared to manufacture a printed circuit board. The carrier board CB may have a structure in which an insulating member CB1 and a metal layer CB2 are disposed on the insulating member CB1.

Figure 9:
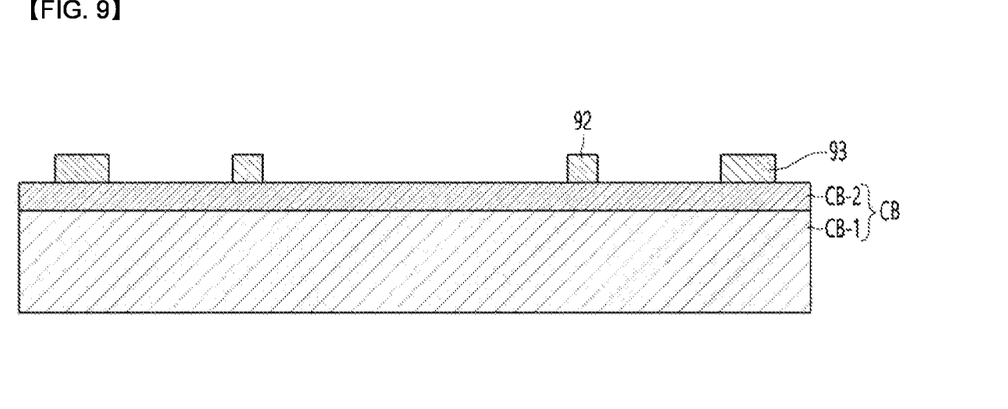

Next, referring to FIG. 9, a plating process of forming circuit patterns 92 and pads 93 on the carrier board CB may be performed.

Figure 10:
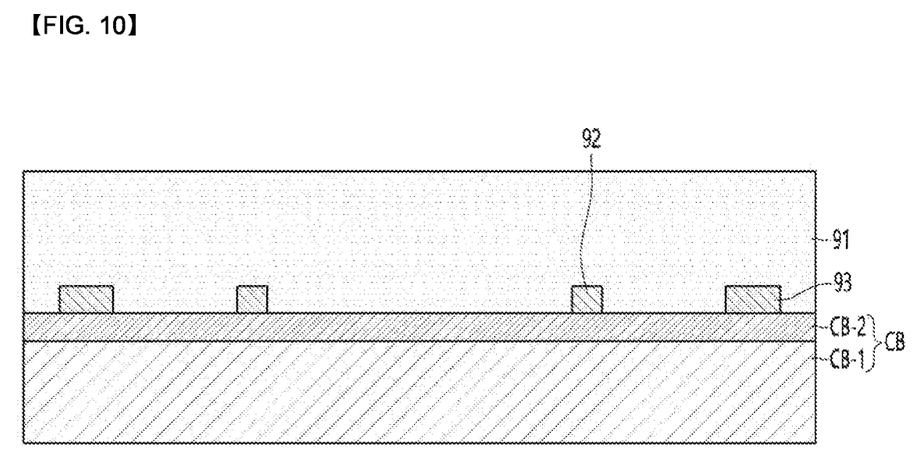

Next, referring to FIG. 10, an insulating layer 91 covering the circuit pattern 92 and the pad 93 may be formed on the carrier board CB.

Figure 11:
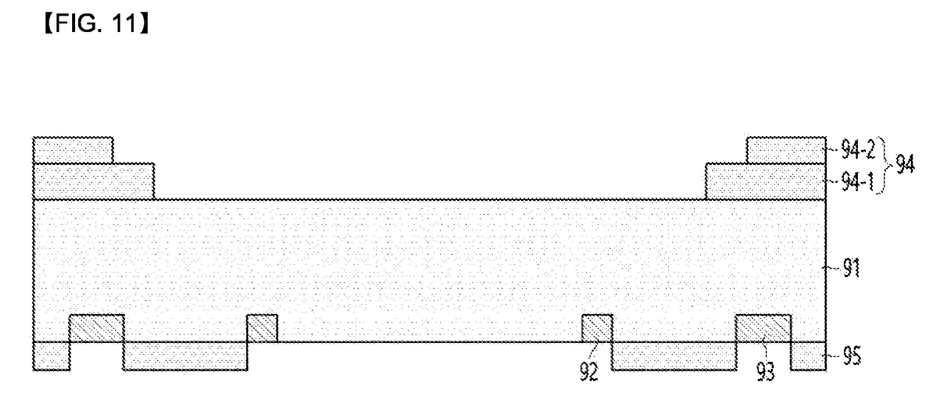

Next, referring to FIG. 11, in the embodiment, a process of removing the carrier board CB may be performed after the insulating layer 91 is formed. In addition, in the embodiment, when the carrier board CB is removed, a process of forming the first protective layer 94 on the upper surface of the insulating layer 91 and a process of forming the second protective layer 95 on the lower surface of the insulating layer 91 may be performed. In this case, the first protective layer 94 may have a two-layer structure including a first-first protective layer 94-1 and a first-second protective layer 94-2. In addition, the first region 82-1 may have a step through a change in the size of the opening of the two-layered protective layer.

Figure 12:
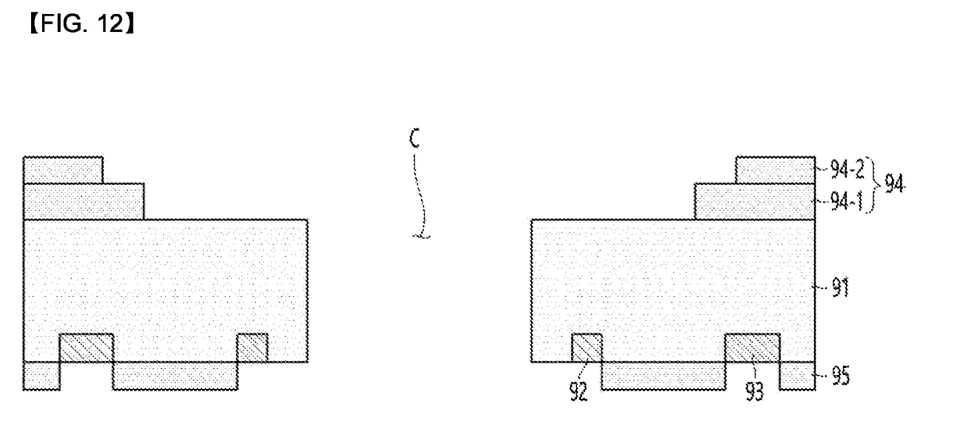

Next, referring to FIG. 12, a process of forming a cavity C penetrating the upper and lower surfaces of the insulating layer 91 may be performed using a CNC drill.

The printed circuit board of the embodiment has an ETS structure in which a circuit pattern is embedded in an insulating layer. Accordingly, the printed circuit board of the embodiment can achieve miniaturization. Furthermore, the embodiment does not need to increase the size of the printed circuit board through miniaturization of the circuit pattern even if the number of terminals increases according to the increase in pixels of the image sensor, and thus the size of the printed circuit board can be reduced.

In addition, the comparative example allows foreign substance such as burrs to remain on the inner wall of the cavity as the cavity is formed through laser processing, and this foreign substance later falls on the image sensor and causes a reliability problem.

Alternatively, the embodiment can completely remove the foreign substance present on the inner wall of the cavity by forming a cavity using a CNC drill, and thereby solving the reliability problem. In addition, the embodiment may form the cavity (C) using a CNC drill, so that an upper width and a lower width of the cavity (C) are the same as each other. That is, the inner wall of the cavity C of the embodiment may be perpendicular to an upper surface or a lower surface of the insulating layer 91. Accordingly, the embodiment can accurately form the cavity (C) corresponding to a target size in the insulating layer, thereby solving the problem of increasing the size of a circuit board.

In addition, the embodiment forms a step on a protective layer made of solder resist, and arranges an infrared filter on the step. Accordingly, the embodiment does not require a separate structure for arranging the infrared filter, thereby reducing a product cost and reducing an overall height of the camera module.

Figure 13:
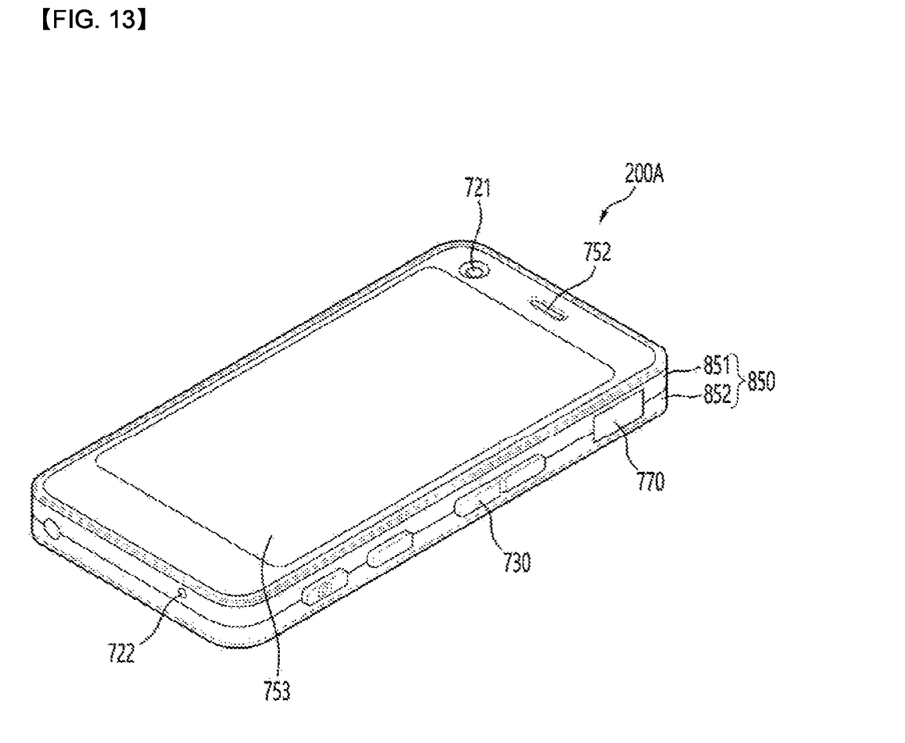
FIG. 13 is a perspective view of a portable terminal according to an embodiment.
Figure 14:
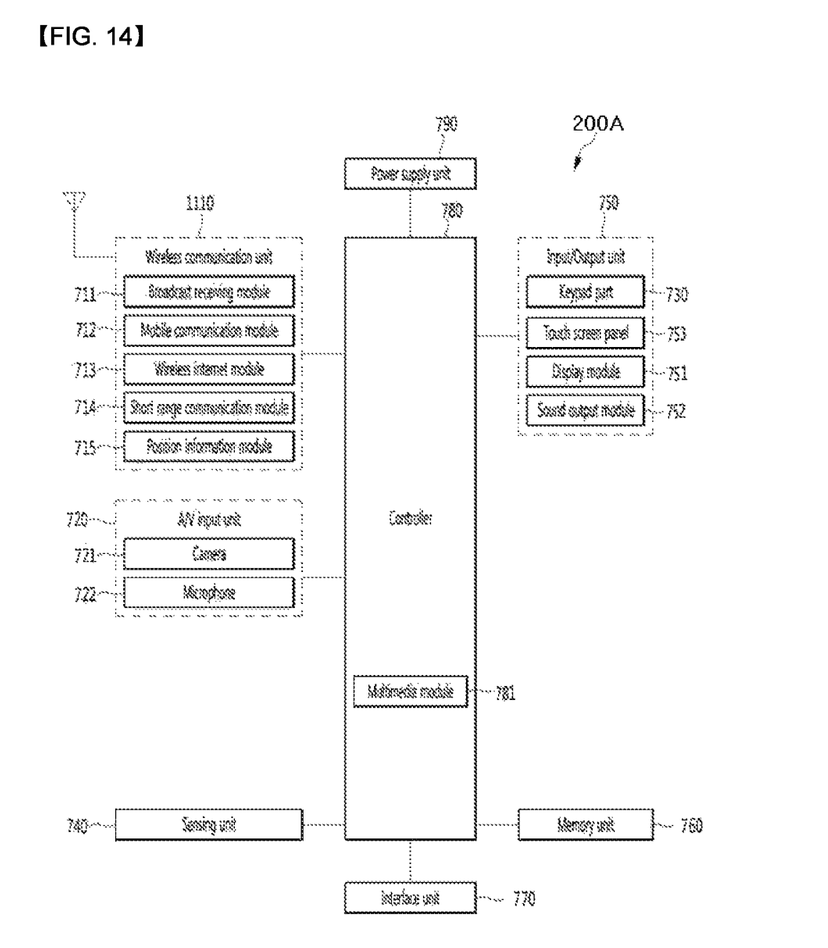
FIG. 14 is a block diagram of a portable terminal shown in FIG. 13.

FIG. 13 is a perspective view of a portable terminal according to an embodiment, and FIG. 14 is a block diagram of a portable terminal shown in FIG. 13.

Referring to FIGS. 13 and 14, a portable terminal (200A, hereinafter referred to as a "terminal") includes a main body 850, a wireless communication unit 710, an NV input unit 720, a sensing unit 740, an input/output unit 750, a memory unit 760, an interface unit 770, a controller 780, and a power supply unit 790.

The main body 850 shown in FIG. 13 has a bar type, but is not limited thereto and may have various structures such as a slide type, a folder type, a swing type, a swivel type, and the like in which two or more sub-bodies are coupled to be relatively movable.

The main body 850 may include a case (casing, housing, and cover) forming an external appearance. For example, the main body 850 may include a front case 851 and a rear case 852. Various electronic components of the terminal may be built in a space formed between the front case 851 and the rear case 852.

The wireless communication unit 710 may include one or more modules that enable wireless communication between the terminal 200A and a wireless communication system or between the terminal 200A and a network in which the terminal 200A e is positioned. For example, the wireless communication unit 710 may include any one or more of a broadcast receiving module 711, a mobile communication module 712, a wireless internet module 713, a short-range communication module 714, and a position information module 715.

The NV input unit 720 is for inputting an audio signal or a video signal and may include any one or more of a camera 721 and a microphone 722.

The camera 721 may include a camera module according to the embodiment shown in FIG. 3.

The sensing unit 740 may sense a current state of the terminal 200A such as an opening/closing state of the terminal 200A, a position of the terminal 200A, a presence of a user contact, orientation of the terminal 200A, acceleration/deceleration of the terminal 200A, and the like to generate a sensing signal for controlling an operation of the terminal 200A. For example, when the terminal 200A is in the form of a slide phone, whether the slide phone is opened or closed may be sensed. In addition, it may be responsible for sensing functions related to whether a power supply unit 790 supplies power or whether an interface unit 770 is coupled to an external device.

The input/output unit 750 may be a configuration for generating an input or output related to vision, hearing, or tactile sense. The input/output unit 750 may generate input data for controlling an operation of the terminal 200A, and may output information processed by the terminal 200A.

The input/output unit 750 may include at least one of a keypad portion 730, a display module 751, a sound output module 752, and a touch screen panel 753. The keypad portion 730 may generate input data by using a keypad input.

The display module 751 may include a plurality of pixels whose color changes according to an electrical signal. For example, the display module 751 may include at least one of a liquid crystal display (LCD), a thin film transistor-liquid crystal display (TFT LCD), an organic light-emitting diode (OLED), a flexible display, and a three-dimensional (3D) display.

The sound output module 752 may output audio data received from the wireless communication unit 710 in a call signal reception, a call mode, a recording mode, a voice recognition mode, or a broadcast reception mode, or output audio data stored in a memory unit 760.

The touch screen panel 753 may convert a change in capacitance generated due to a user's touch on a specific region of a touch screen into an electrical input signal.

The memory unit 760 may store a program for processing and controlling a controller 780. In addition, the memory unit 760 may store input/output data, for example, any one or more of a phone book, a message, audio, a still image, a photo, and a video. The memory unit 760 may store an image captured by the camera 721, for example, a picture or a video.

The interface unit 770 serves as a path for connecting with an external device connected to the terminal 200A. The interface unit 770 may receive data from an external device, receive power to transfer to each element inside the terminal 200A, or transmit data within the terminal 200A to an external device. The interface unit 770 may include any one or more of a wired/wireless headset port, an external charger port, a wired/wireless data port, a memory card port, a port connecting a device equipped with an identification module, and audio input/output (I/O) port, a video input/output (I/O) port, and an earphone port.

The controller 780 may control an overall operation of the terminal 200A. The controller 780 may perform related control and processing for voice call, data communication, video call, and the like.

The controller 780 may include a multimedia module 781 for playing multimedia. The multimedia module 781 may be provided in the controller 780, or may be provided separately from the controller 780.

The controller 780 may perform a pattern recognition processing for recognizing a writing input or a drawing input performed on a touch screen as text and an image, respectively.

The power supply unit 790 may receive an external power source or an internal power source by a control of the controller 780 to supply the power necessary for operating each element.

Features, structures, effects, etc. described in the above embodiments are included in at least one embodiment, and it is not necessarily limited to only one embodiment. Furthermore, features, structures, effects, etc. illustrated in each embodiment can be combined or modified for other embodiments by those of ordinary skill in the art to which the embodiments belong. Accordingly, the contents related to such combinations and variations should be interpreted as being included in the scope of the embodiments.

What is claimed is:

1. A camera module, comprising:
   an image sensor;
   a circuit board disposed on the image sensor; and
   an infrared filter disposed on the circuit board,
   wherein the circuit board includes:
   an insulating layer including a cavity overlapping each of at least a part of the infrared filter and at least a part of the image sensor in an optical axis direction; and
   a circuit pattern buried in the insulating layer and connected to a terminal of the image sensor; and
   wherein a planar shape of the cavity is different from a planar shape of the image sensor.

2. The camera module of claim 1, wherein the planar shape of the image sensor has a square shape, and
   wherein the planar shape of the cavity has a circular shape.

3. The camera module of claim 1, wherein an upper width of of the cavity is the same as a lower width of the cavity.

4. The camera module of claim 3, wherein an inner wall of the cavity is perpendicular to the upper or lower surface of the insulating layer.

5. The camera module of claim 1, wherein a surface roughness of an inner wall of the cavity has a range of 0.01 um to 0.1 um.

6. The camera module of claim 1, wherein the image sensor includes a pixel region and a passivation region, and
wherein the pixel region includes a first region overlapping the cavity in the optical axis direction and a second region overlapping the insulating layer in the optical axis direction.

7. The camera module of claim 1, wherein the image sensor includes an active pixel region, a dummy pixel region, and a passivation region;
wherein the active pixel region overlaps the cavity in the optical axis direction;
wherein the dummy pixel region includes a first region overlapping the cavity in the optical axis direction together with the active pixel region, and a second region overlapping the insulating layer in the optical axis direction.

8. The camera module of claim 7, wherein the second region includes a corner region of the dummy pixel region of the image sensor.

9. The camera module of claim 1, wherein the circuit board includes a first protective layer disposed on the insulating layer, and
wherein the first protective layer includes:
a first-first protective layer disposed on the insulating layer; and
a first-second protective layer disposed on the first-first protective layer and having a step with the first-first protective layer.

10. The camera module of claim 9, wherein the first-first protective layer includes a first opening overlapping the cavity in the optical axis direction;
wherein the first-second protective layer includes a second opening overlapping the cavity and the first opening in an optical axis direction; and
wherein a width of the first opening in a horizontal direction is different from a width of the second opening in a horizontal direction.

11. The camera module of claim 10, wherein the width of the first opening in the horizontal direction is smaller than the width of the second opening in the horizontal direction.

12. The camera module of claim 10, wherein the second opening of the first-second protective layer overlaps a part of an upper surface of the first-first protective layer in an optical axis direction.

13. The camera module of claim 12, wherein the infrared filter is disposed in the second opening of the first-second protective layer.

14. The camera module of claim 13, wherein the infrared filter is disposed on an upper surface of the firs-first protective layer overlapping the second opening of the first-second protective layer in an optical axis direction.

15. The camera module of claim 10, wherein the first-first protective layer and the first-second protective layer have different properties.

16. The camera module of claim 1, wherein the circuit board includes:
a pad buried in a lower portion of the insulating layer;
a second protective layer including an opening overlapping the pad in an optical axis direction; and
a solder ball disposed in the opening of the second protective layer.

17. The camera module of claim 1, further comprising:
a lens barrel disposed on the circuit board; and
a lens disposed within the lens barrel.

18. The camera module of claim 17, wherein a planar shape of the lens is different from a planar shape of the image sensor.

19. The camera module of claim 18, wherein the planar shape of the lens is the same as the planar shape of the cavity.

* * * * *